(12) United States Patent
Hattori

(10) Patent No.: US 9,148,078 B2
(45) Date of Patent: Sep. 29, 2015

(54) SWITCH DRIVING CIRCUIT

(71) Applicant: Rohm Co., Ltd., Kyoto (JP)

(72) Inventor: Takuya Hattori, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 127 days.

(21) Appl. No.: 14/080,219

(22) Filed: Nov. 14, 2013

(65) Prior Publication Data
US 2014/0139160 A1 May 22, 2014

(30) Foreign Application Priority Data

Nov. 19, 2012 (JP) ................................ 2012-253022

(51) Int. Cl.
| H03K 3/00 | (2006.01) |
| H02P 6/14 | (2006.01) |
| H03K 5/13 | (2014.01) |
| H03K 17/00 | (2006.01) |
| H03K 5/151 | (2006.01) |
| H03K 17/16 | (2006.01) |
| H02M 1/08 | (2006.01) |
| H02M 1/38 | (2007.01) |
| H03K 5/00 | (2006.01) |

(52) U.S. Cl.
CPC . *H02P 6/14* (2013.01); *H02M 1/08* (2013.01); *H02M 1/38* (2013.01); *H03K 5/133* (2013.01); *H03K 5/1515* (2013.01); *H03K 17/00* (2013.01); *H03K 17/162* (2013.01); *H03K 2005/00071* (2013.01)

(58) Field of Classification Search
CPC ............... H03K 3/02; H03K 5/12; H02P 6/14
USPC ............. 318/400.13, 400.26, 400.27, 400.28, 318/400.29, 673, 400.01, 700, 701, 727, 318/801, 810, 283, 285, 478, 484; 307/412; 345/110; 327/108, 109; 361/152
See application file for complete search history.

(56) References Cited

U.S. PATENT DOCUMENTS

| 6,294,954 B1 * | 9/2001 | Melanson ........................ 330/10 |
| 8,035,364 B2 * | 10/2011 | Williams ........................ 323/282 |
| 8,710,873 B2 * | 4/2014 | Barrenscheen et al. ...... 327/108 |

FOREIGN PATENT DOCUMENTS

| JP | 2006-325256 | 11/2006 |
| JP | 2010-178437 | 8/2010 |

* cited by examiner

*Primary Examiner* — Antony M Paul
(74) *Attorney, Agent, or Firm* — Fish & Richardson P.C.

(57) ABSTRACT

A switch driving circuit has: a switch signal generator adapted to generate switch signals to complementarily turn on and off switches connected in parallel between a node to which an input voltage is applied and a node to which a ground voltage is applied; drivers adapted to generate gate signals in response to the switch signals; and a dead time setter adapted to set dead times during which the switches are both kept off. At least one of the drivers includes a slew rate setter adapted to vary the slew rate of the gate signals according to a slew rate setting signal. The dead time setter controls to vary at least one of the dead times according to at least one of the slew rate setting signal and the input voltage.

15 Claims, 16 Drawing Sheets

SWITCH DRIVING CIRCUIT

CROSS-REFERENCE TO RELATED APPLICATIONS

This application is based on the following Japanese Patent Applications, and the contents of which are hereby incorporated by reference:
(1) Japanese Patent Application No. 2012-253022 (the filing date: Nov. 19, 2012)

BACKGROUND OF THE INVENTION

1. Field of the Invention
The present invention relates to a switch driving circuit.
2. Description of Related Art
Conventionally, a switch driving circuit, which complementarily turns on/off a first switch and a second switch connected in series between two different electric potential points, has a dead time (concurrent turning-on prevention period) for turning off both switches as a purpose for preventing a through-current when switching on/off states of each switch (e.g., see JP-A-2010-178437).

Besides, conventionally, also an output driver circuit, which can adjust a slew rate of a gate signal for turning on/off a switch, is disclosed (e.g., see JP-A-2006-325256).

Because an electric current flows in a body diode parasitic in a switch (MOSFET [metal oxide semiconductor field effect transistor] and IGBT [insulated gate bipolar transistor]) during the dead time, power loss caused by a forward drop voltage occurs. Accordingly, in light of efficiency increase (power consumption reduction), it is desirable that the dead time is as short as possible. However, if the dead time is set too short, the first switch and the second switch become likely to be easily turned on concurrently; there is a high risk that a through-current occurs. Because of this, it becomes important to set the dead time at an appropriate length considering both efficiency increase and safety securing.

In the meantime, the shortest possible dead time necessary for preventing the through-current changes depending on various circuit conditions (slew rate, input voltage and the like). However, in the conventional switch driving circuit, the dead time is set fixedly under a circuit condition expected in advance. Because of this, there is a risk that if the circuit condition changes, the dead time becomes unnecessarily long or short.

SUMMARY OF THE INVENTION

In light of the problem found by the inventor of the present application, it is an object of the present invention to provide a switch driving circuit capable of setting the dead time appropriately.

To achieve the object, a switch driving circuit disclosed in the present specification has a structure that includes: a switch signal generation portion that generates a first switch signal and a second switch signal to complementarily turn on/off a first switch whose first terminal is connected to an application terminal for a first voltage and a second switch whose first terminal is connected to a second terminal of the first switch and whose second terminal is connected to an application terminal for a second voltage that is lower than the first voltage; a first driver portion that receives an input of the first switch signal to generate a first gate signal for turning on/off the first switch; a second driver portion that receives an input of the second switch signal to generate a second gate signal for turning on/off the second switch; and a dead time setting portion that sets a first dead time which extends from a time when the first switch is turned off to a time when the second switch is turned on, and a second dead time which extends from a time when the second switch is turned off to a time when the first switch is turned on; wherein at least one of the first driver portion and the second driver portion includes a slew rate setting portion that changes a slew rate of each gate signal in accordance with a slew rate setting signal; and the dead time setting portion variably controls at least one of the first dead time and the second dead time in accordance with at least one of the slew rate setting signal and the first voltage.

In the meantime, other features, elements, steps, advantages and characteristics of the present invention will become more apparent from the following detailed description of preferred embodiments of the present invention with reference to the attached drawings.

DETAILED DESCRIPTION OF PREFERRED EMBODIMENTS

Figure 1:
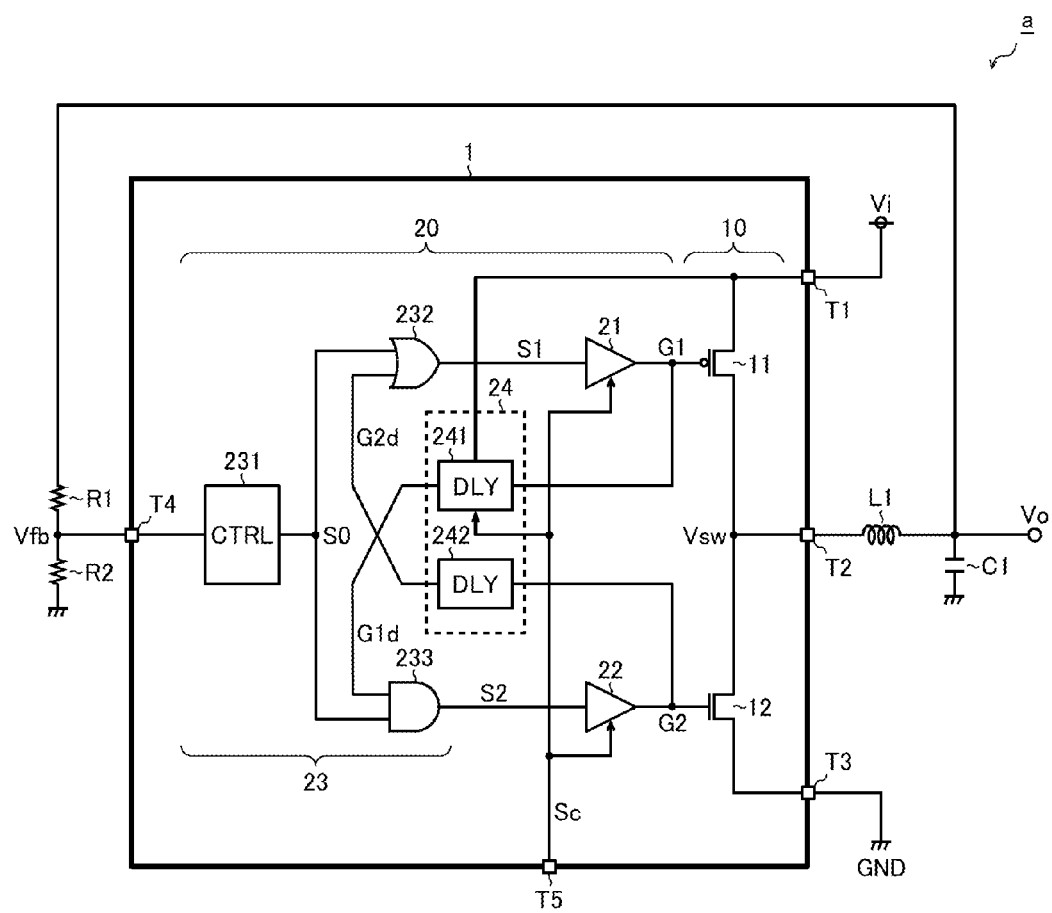
FIG. 1 is a block diagram showing a structural example of a switching regulator of voltage step-down type.

<Switching Regulator of Voltage Step-Down Type>
FIG. 1 is a block diagram showing a structural example of a switching regulator of voltage step-down type. A switching regulator a of voltage step-down type in the present structural example has: a semiconductor apparatus 1; and various discrete components (coil capacitor C1, resistors R1 and R2) externally connected to the semiconductor 1.

The semiconductor apparatus 1 is a switching regulator IC (which corresponds to a switch driving apparatus) that integrates a switch output stage 10 and a switch driving circuit 20, and has at least external terminals T1 to T5 to secure electric connection with outside. Outside the semiconductor apparatus 1, the external terminal (power supply terminal) T1 is connected to an application terminal for an input voltage V1. The external terminal (switch terminal) T2 is connected to a first terminal of the coil L1 (application terminal for switch voltage Vsw). A second terminal of the coil L1, a first terminal of the capacitor C1, and a first terminal of the resistor R1 are all connected to an application terminal for an output voltage Vo. A second terminal of the capacitor C1 is connected to an application terminal for a ground voltage GND. The coil L1 and the capacitor C1 function as a rectification smoothing portion that rectifies and smoothes the switch voltage Vsw, which has a rectangular waveform and appears at the external terminal T2, to generate the output voltage Vo. A second terminal of the resistor R1 and a first terminal of the resistor R2 both are connected to the external terminal (feedback terminal) T4 of the semiconductor apparatus 1. The second terminal of the resistor R2 is connected to the application terminal for the ground voltage GND. The resistors R1 and R2 function as a feedback voltage generation portion that outputs a feedback voltage Vfb (divided voltage of the output voltage Vo) from a connection node between them. The external terminal (ground terminal) T3 is connected to the application terminal for the ground voltage GND. The external terminal (slew rate setting terminal) T5 is connected to an application terminal for a slew rate setting signal Sc.

The switch output stage 10 includes a switch 11 (MOS field effect transistor of P channel type) and a switch 12 (MOS field effect transistor of N channel type). A first terminal (source) of the switch 11 is connected to the external terminal T1 (application terminal for the input voltage V1). A second terminal (drain) of the switch 11 and a first terminal (drain) of the switch 12 both are connected to the external terminal T2. A second terminal (source) of the switch 12 is connected to the external terminal T3 (application terminal for the ground voltage GND). Control terminals (gates) of the switches 11 and 12 are connected to application terminals for the gate signals G1 and G2, respectively. The switch 11 is turned off when the gate signal G1 is at a high level, and turned on when the gate signal G1 is at a low level. On the other hand, the switch 12 is turned off when the gate signal G2 is at a low level, and turned on when the gate signal G2 is at a high level.

The switch driving circuit 20 is a circuit block that drives the switch output stage 10, and includes: driver portions 21 and 22; a switch signal generation portion 23; and a dead time setting portion 24.

The driver portion 21 receives an input of a switch signal S1 to generate the gate signal G1 for turning on/off the switch 11. On the other hand, the driver portion 22 receives an input of a switch signal S2 to generate the gate signal G2 for turning on/off the switch 12. In the meantime, the driver portions 21 and 22 include a slew rate setting portion that changes the respective slew rates of the gate signals G1 and G2 in accordance with a slew rate setting signal Sc. This point is described later.

The switch signal generation portion 23 is a circuit block that generates the switch signals S1 and S2 to complementarily (exclusively) turn on/off the switches 11 and 12, and includes: a control portion 231; an OR gate 232; and an AND gate 233. In the meantime, the term "complementarily (exclusively)" used in the present specification covers a case where on/off states of the switches 11 and 12 are completely opposite to each other and a case as well where a predetermined delay is given to on/off transition timings of the switches 11 and 12 (case where a dead time is disposed).

The control portion 231 generates a reference switch signal S0 such that the feedback voltage Vfb becomes equal to a predetermined target value. As a method for generating the reference switch signal S0, publicly known output feedback control (PWM [pulse width modulation] control and PFM [pulse frequency modulation] control) is sufficiently used; accordingly, detailed description is skipped.

The OR gate 232 performs logical sum calculation of the reference switch signal S0 and delay gate signal G2d to generate the switch signal S1. Accordingly, the switch signal S1 goes to a high level when at least one of the reference switch signal S0 and delay gate signal G2d is at a high level, and goes to a low level when both signals are at a low level.

The AND gate 233 performs logical product calculation of the reference switch signal S0 and delay gate signal G1d to generate the switch signal S2. Accordingly, the switch signal S2 goes to a low level when at least one of the reference switch signal S0 and delay gate signal G1d is at a low level, and goes to a high level when both signals are at a high level.

The dead time setting portion 24 is a circuit block that sets a dead time Td1 that extends from a time when the switch 11 is turned off to a time when the switch 12 is turned on, and a dead time Td2 that extends from a time when the switch 12 is turned off to a time when the switch 11 is turned on, and includes delay portions 241 and 242.

The delay portion 241 generates the delay gate signal G1d by giving a delay, which corresponds to the dead time Td1, to the gate signal G1. On the other hand, the delay portion 242 generates the delay gate signal G2d by giving a delay, which corresponds to the dead time Td2, to the gate signal G2.

In the meantime, the dead time setting portion 24 in the present structural example is structured to variably control the dead time Td1 (size of the delay given to the gate signal G1 in the delay portion 241) in accordance with both slew rate setting signal Sc and input voltage V1. This point is described later.

<Dead Time Setting Portion>

Figure 2:
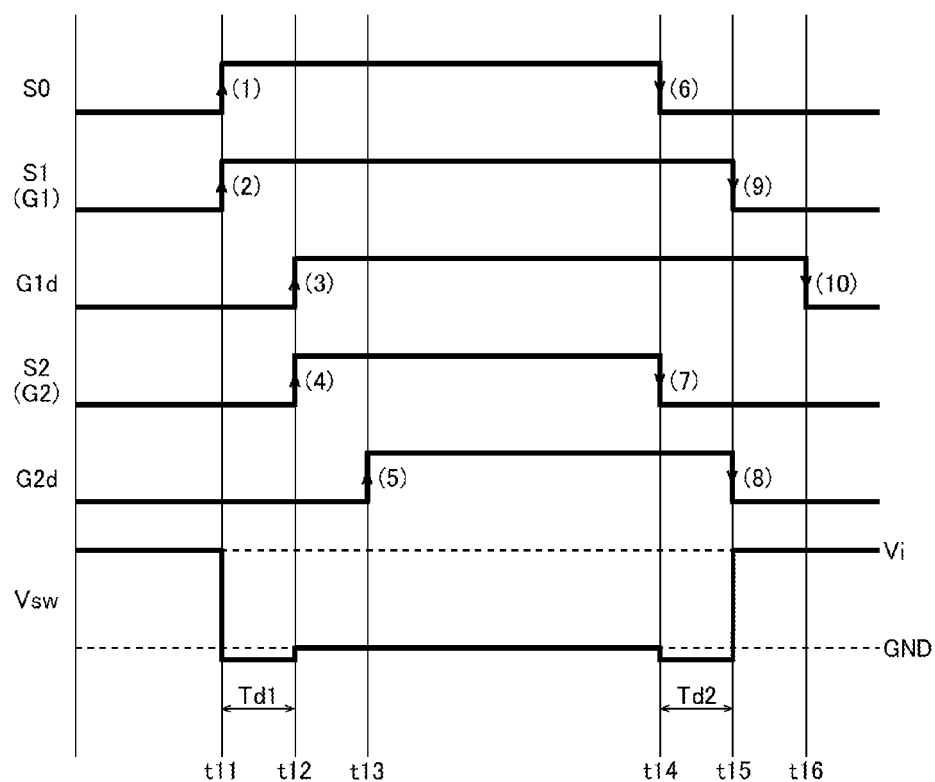
FIG. 2 is a timing chart showing a dead time giving operation.

First, a basic dead time giving operation is described in detailed with reference to FIG. 2. FIG. 2 is a timing chart showing an example of the dead time giving operation, and illustrates, from top in order, the reference switch signal S0; the switch signal S1 (gate signal G1); the delay gate signal G1d; the switch signal S2 (gate signal G2); the delay gate signal G2d; and the switch voltage Vsw. In the meantime, numbers (1) to (10) attached to pulse edges in the figure indicate a transition order of a logic level.

At a time t11, if the reference switch signal S0 rises to the high level, the switch signal S1 (gate signal G1) rises to the high level; accordingly, the switch 11 is turned off. On the other hand, at the time t11, the delay gate signal G1d is kept at the low level; accordingly, the switch signal S2 (gate signal G2) does not rise to the high level, and the switch 12 is still kept in an off-state. As a result of this, the switches 11 and 12 go to a concurrent off-state. At this time, an electric current flows in a body diode parasitic in the switch 12 from the external terminal T3 to the external terminal T2; accordingly, the switch voltage Vsw declines to a negative voltage (=GND−Vf) that is lower than the ground voltage GND by a forward drop voltage of the body diode.

If the dead time Td1 passes from the time t11 and the delay gate signal G1d rises to the high level at a time t12, the switch signal S2 (gate signal G2) rises to the high level; accordingly, the switch 12 is turned on. As a result of this, the switch voltage Vsw increases to substantially the ground voltage GND.

Thereafter, at a time t13, the delay gate signal G2d rises to the high level. However, at this time, the switch signal S1 is already at the high level; accordingly, no change occurs in on/off states of the switch 11.

At a time t14, if the reference switch signal S0 drops to the low level, the switch signal S2 (gate signal G2) drops to the low level; accordingly, the switch 12 is turned off. On the other hand, at the time t14, the delay gate signal G2d is kept at the high level; accordingly, the switch signal S1 (gate signal G1) does not drop to the low level, and the switch 11 is still kept in the off-state. As a result of this, the switches 11 and 12 go to the concurrent off-state. At this time, an electric current flows in the body diode parasitic in the switch 12 from the external terminal T3 to the external terminal T2; accordingly, the switch voltage Vsw declines to the negative voltage (=GND−Vf) that is lower than the ground voltage GND by the forward drop voltage of the body diode.

If the dead time Td2 passes from the time t14 and the delay gate signal G2d drops to the low level at a time t15, the switch signal S1 (gate signal G1) drops to the low level; accordingly, the switch 11 is turned on. As a result of this, the switch voltage Vsw increases to substantially the input voltage V1.

Thereafter, at a time t16, the delay gate signal G1d drops to the low level. However, at this time, the switch signal. S2 is already at the low level; accordingly, no change occurs in on/off states of the switch 12.

As described above, the switch signal generation portion 23 logically generates the reference switch signal S0 and the delay gate signal G1d to generate the switch signal S2 such that the switch 12 is turned on after the dead time Td1 elapses after the switch 11 is turned off, and logically generates the reference switch signal S0 and the delay gate signal G2d to generate the switch signal S1 such that the switch 11 is turned on after the dead time Td2 elapses after the switch 12 is turned off. By employing such a structure, it becomes possible to avoid the concurrent turning-on of the switches 11 and 12 and to prevent a through-current from occurring.

Next, a structure and operation of the delay portion 241, which includes a function to adjust the dead time Td1, is described in detail.

Figure 3:
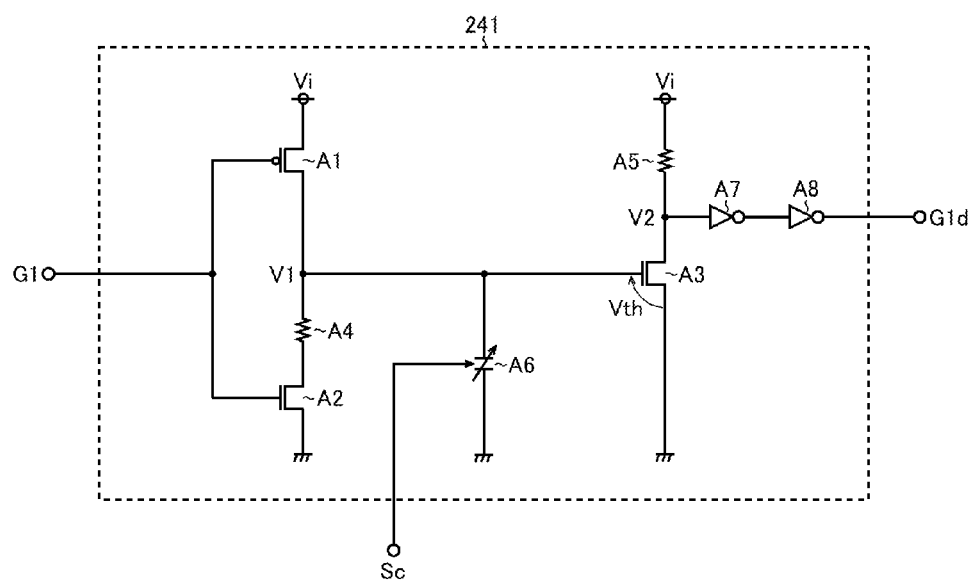
FIG. 3 is a circuit diagram showing a structural example of a delay portion 241.

FIG. 3 is a circuit diagram showing a structural example of the delay portion 241. The delay portion 241 in the present structural example includes: a MOS field effect transistor A1 of P channel type; MOS field effect transistors A2 and A3 of N channel type; resistors A4 and A5; a capacitor A6; inverters A7 and A8.

A source of the transistor A1 is connected to the application terminal for the input voltage Vi. A drain of the transistor A1 is connected to a gate of the transistor A3. A gate of the transistor A1 is connected to the application terminal for the gate signal G1. A drain of the transistor A2 is connected to the gate (application terminal for the voltage V1) of the transistor A3 via the resistor A4. A source of the transistor A2 is connected to the ground terminal. A gate of the transistor A2 is connected to the application terminal for the gate signal G1. A first terminal of the capacitor A6 is connected to the gate of the transistor A3. A second terminal of the capacitor A6 is connected to the ground terminal. In the meantime, a capacitance value of the capacitor A6 is variably controlled by the slew rate setting signal Sc. Describing more specifically, the capacitance value of the capacitor A6 becomes smaller as the slew rates of the gate signals G1 and G2 become faster, and becomes larger as the slew rates of the gate signals G1 and G2 become slower. A drain of the transistor A3 is connected to a connection node (application terminal for the voltage V2) between an input terminal of the inverter A7 and a first terminal of the resistor A5. A second terminal of the resistor A5 is connected to the application terminal for the input voltage Vi. A source of the transistor A3 is connected to the ground terminal. An output terminal of the inverter A7 is connected to an input terminal of the inverter A8. An output terminal of the inverter A8 is connected to an application terminal for the delay gate signal G1d.

Figure 4:
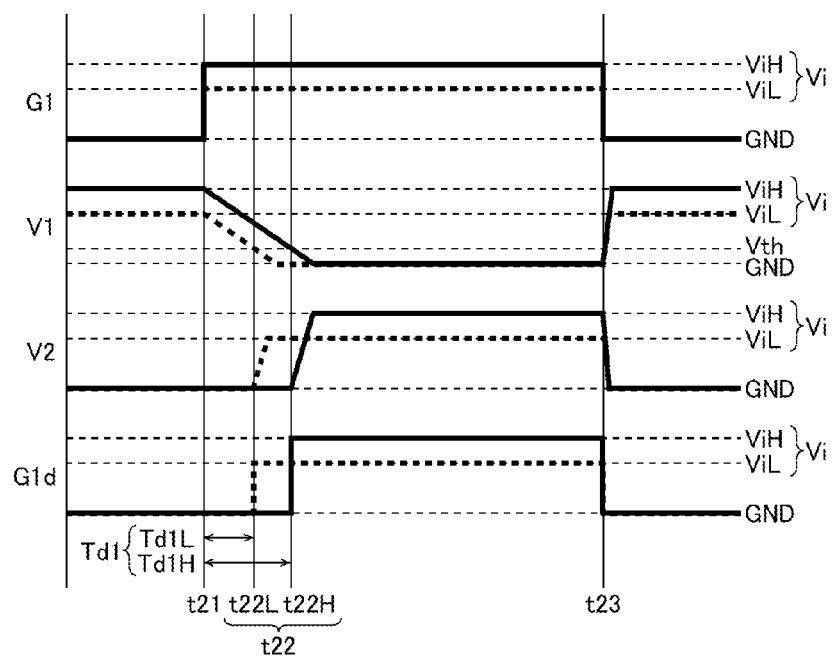
FIG. 4 is a timing chart showing a first generation example of a delay gate signal G1d.

FIG. 4 is a timing chart showing a first generation example of the delay gate signal G1d, and illustrates, from top in order, the gate signal G1; the voltages V1 and V2; and the delay gate signal G1d. In the meantime, in FIG. 4, a case, where the slew rate setting signal Sc has a constant value and the input voltage V1 has a variable value ViH/ViL (where ViH>ViL), is described as an example.

At a time t21, if the gate signal G1 rises to the high level, the transistor A1 is turned off and the transistor A2 is turned on. Accordingly, the voltage V1 stored between both terminals of the capacitor A6 is discharged at a time constant τ(=R×C) corresponding to a resistance value R of the resistor A4 and a capacitance value C of the capacitor A6. In the meantime, at the time t21, the voltage V1 is larger than an on-threshold voltage Vth of the transistor A3; accordingly, the transistor A3 is still kept in the on-state. Therefore, the voltage V2 goes to a state to be kept at the low level, and also the delay gate signal G1d goes to a state to be kept at the low level.

At a time t22, if the voltage V1 becomes lower than the on-threshold voltage Vth of the transistor A3, the transistor A3 is turned off; accordingly, the voltage V2 rises to the high level, and also the delay gate signal G1d rises to the high level.

Here, a delay period (which corresponds to the dead time Td1 that extends from a time when the gate signal G1 rises to the high level to a time when the gate signal G2 rises to the high level), which extends from a time when the gate signal G1 rises to the high level to a time when the delay gate signal G1d rises to the high level, is decided by a discharge period which extends from a time when a discharge of the capacitor A6 is started to a time when the voltage V1 becomes lower than the on-threshold voltage Vth of the transistor A3. This discharge period becomes longer as the input voltage V1 becomes higher, and becomes shorter as the input voltage Vi becomes lower. For example, in a case where Vi=ViH, Td1=Td1H (solid line), and in a case where Vi=ViL, Td1=Td1L (<Td1H) (broken line).

At a time t23, if the gate signal G1 drops to the low level, the transistor A1 is turned on and the transistor A2 is turned off. A resistor is not connected to the drain of the transistor A1; accordingly, the capacitor A6 is quickly charged until the voltage V1 reaches the input voltage V1. As a result of this, the transistor A3 is turned on with no delay; accordingly, the voltage V2 drops to the low level, and also the delay gate signal G1d drops to the low level.

Figure 5:
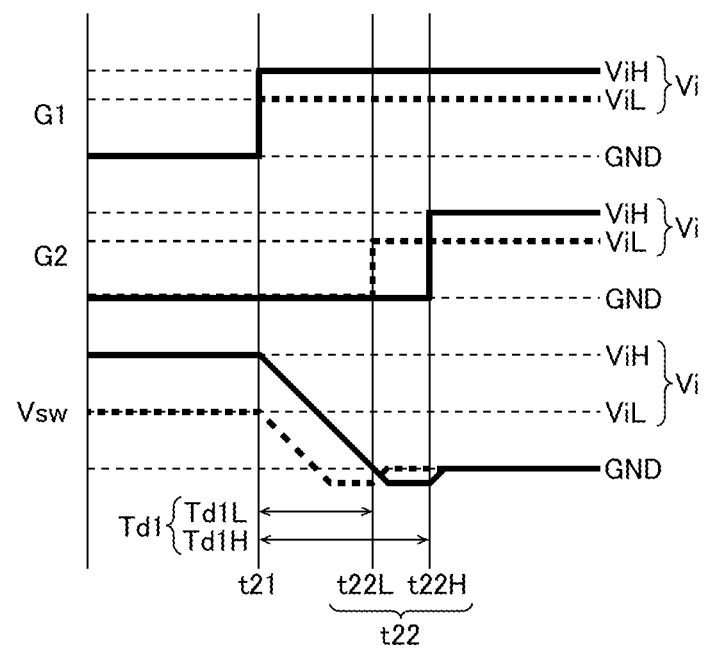
FIG. 5 is a timing chart showing a first adjustment example of a dead time Td1.

FIG. 5 is a timing chart showing a first example of adjusting the dead time Td1, and illustrates, from top in order, the gate signals G1 and G2; and the switch voltage Vsw. In the meantime, in FIG. 5, a case, where the slew rate setting signal Sc has a constant value and the input voltage V1 has a variable value (where ViH>ViL), is described as an example.

As shown in FIG. 5, a period required for the switch voltage Vsw to decline from the high level to the low level becomes longer as the input voltage V1 becomes higher (solid line), and becomes shorter as the input voltage V1 becomes lower (broken line). Because of this, the dead time setting portion 24 makes the dead time Td1 longer (Td1=Td1H) as the input voltage Vi becomes higher, and makes the dead time Td1 shorter (Td1=Td1L) as the input voltage Vi becomes lower. By performing such variable control of the dead time Td1, it is possible to appropriately set the dead time Td1 in accordance with the input voltage Vi; accordingly, it becomes possible to achieve both efficiency increase and safety securing.

Figure 6:
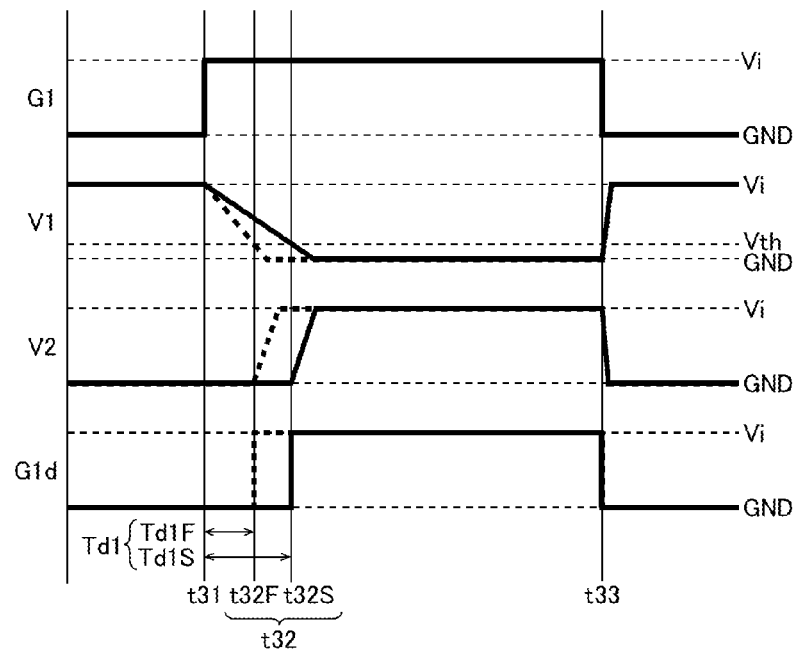
FIG. 6 is a timing chart showing a second generation example of the delay gate signal G1d.

FIG. 6 is a timing chart showing a second example of generating the delay gate signal G1d, and illustrates, from top in order, the gate signal G1; the voltages V1 and V2; and the delay gate signal G1d. In the meantime, in FIG. 6, a case, where the slew rate setting signal Sc (and the capacitance value C of the capacitor A6) has a variable value and the input voltage Vi has a fixed value, is described as an example.

At a time t31, if the gate signal G1 rises to the high level, the transistor A1 is turned off and the transistor A2 is turned on. Accordingly, the voltage V1 stored between both terminals of the capacitor A6 is discharged at the time constant τ(=R×C) corresponding to the resistance value R of the resistor A4 and the capacitance value C of the capacitor A6. In the meantime, at the time t31, the voltage V1 is larger than then on-threshold voltage Vth of the transistor A3; accordingly, the transistor A3 is still kept in the on-state. Therefore, the voltage V2 goes to the state to be kept at the low level, and also the delay gate signal G1d goes to the state to be kept at the low level.

At a time t32, if the voltage V1 becomes lower than the on-threshold voltage Vth of the transistor A3, the transistor A3 is turned off; accordingly, the voltage V2 rises to the high level, and also the delay gate signal G1d rises to the high level.

Here, a delay period (which corresponds to the dead time Td1 that extends from a time when the gate signal G1 rises to the high level to a time when the gate signal G2 rises to the high level), which extends from a time when the gate signal G1 rises to the high level to a time when the delay gate signal G1d rises to the high level, is decided by the discharge period which extends from a time when the discharge of the capacitor A6 is started to a time when the voltage V1 becomes lower than the on-threshold voltage Vth of the transistor A3. This discharge period becomes longer as the capacitance value C of the capacitor A6 becomes larger, and becomes shorter as the capacitance value C of the capacitor A6 becomes smaller.

For example, in a case where the slew rates of the gate signals G1 and G2 are set at slow values by using the slew rate setting signal Sc, following the values, the capacitance value C of the capacitor A6 is set at a large value, whereby Td1=Td1S (solid line). On the other hand, in a case where the slew rates of the gate signals G1 and G2 are set at fast values by using the slew rate setting signal Sc, following the values, the capacitance value C of the capacitor A6 is set at a small value, whereby Td1=Td1F (<Td1S) (broken line).

At a time t33, if the gate signal G1 drops to the low level, the transistor A1 is turned on and the transistor A2 is turned off. A resistor is not connected to the drain of the transistor A1; accordingly, the capacitor A6 is quickly charged until the voltage V1 reaches the input voltage Vi. As a result of this, the transistor A3 is turned on with no delay; accordingly, the voltage V2 drops to the low level, and also the delay gate signal G1d drops to the low level.

Figure 7:
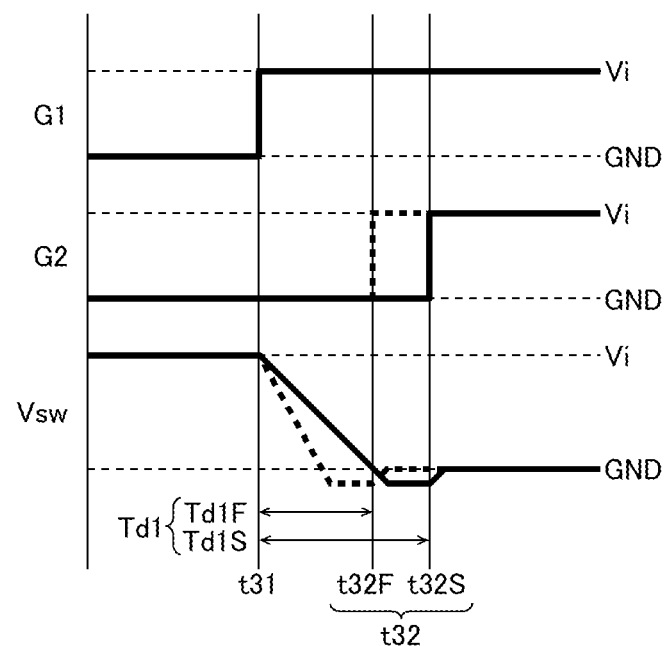
FIG. 7 is a timing chart showing a second adjustment example of the dead time Td1.

FIG. 7 is a timing chart showing a second example of adjusting the dead time Td1, and illustrates, from top in order, the gate signals G1 and G2; and the switch voltage Vsw. In the meantime, in FIG. 7, a case, where the slew rate setting signal Sc (and the capacitance value C of the capacitor A6) has a variable value and the input voltage Vi has a fixed value, is described as an example.

As shown in FIG. 7, a period required for the switch voltage Vsw to decline from the high level to the low level becomes longer as the slew rate becomes slower (solid line), and becomes shorter as the slew rate becomes faster (broken line). Because of this, the dead time setting portion 24 makes the dead time Td1 longer (Td1=Td1S) as the slew rate becomes slower, and makes the dead time Td1 shorter (Td1=Td1F) as the slew rate becomes faster. By performing such variable control of the dead time Td1, it is possible to appropriately set the dead time Td1 in accordance with the slew rate; accordingly, it becomes possible to achieve both efficiency increase and safety securing.

Figure 8:
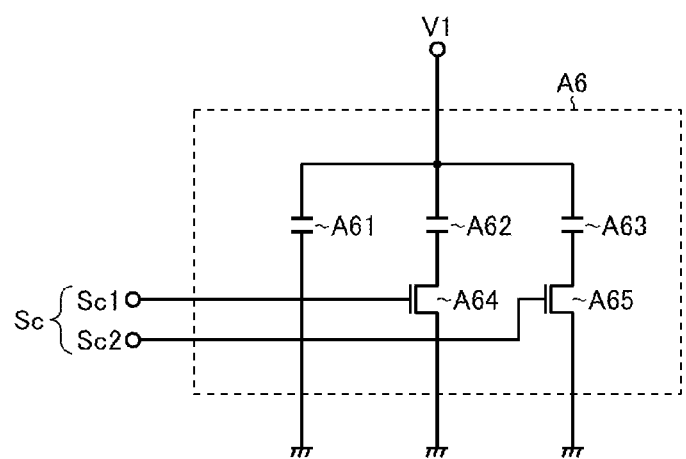
FIG. 8 is a circuit diagram showing a structural example of a capacitor A6.

FIG. 8 is a circuit diagram showing a structural example of the capacitor A6. The capacitor A6 in the present structural example includes: capacitors A61 to A53; and MOS field effect transistors A64 to A65 of N channel type. In the meantime, in the following description, capacitance values of the capacitors A61 and A62 both are set at 1 pF and a capacitance value of the capacitor A63 is set at 2 pF; however, the respective capacitance values are not limited to these. Besides, it is possible to arbitrarily increase an decrease the parallel number of capacitors.

First terminals of the capacitors A61 to A63 are all connected to the application terminal for the voltage V1. A second terminal of the capacitor A61 is connected to the ground terminal. A second terminal of the capacitor A62 is connected to a drain of the transistor A64. A source of the transistor A64 is connected to the ground terminal. A gate of the transistor A64 is connected to an application terminal for the slew rate setting signal Sc1. A second terminal of the capacitor A63 is connected to a drain of the transistor A65. A source of the transistor A65 is connected to the ground terminal. A gate of the transistor A65 is connected to an application terminal for the slew rate setting signal Sc2.

In the capacitor A6 having the above structure, in a case where the slew rate setting signals Sc1 and Sc2 both are at a low level, the capacitance value C of the capacitor A6 reaches the capacitance value (1 pF) of the capacitor A61. Besides, in a case where the slew rate setting signal Sc1 is at a high level and the slew rate setting signal Sc2 is at the low level, the capacitance value C of the capacitor A6 reaches a resultant capacitance value (2 pF=1 pF+1 pF) of the capacitors A61 and A62. Besides, in a case where the slew rate setting signal Sc1 is at the low level and the slew rate setting signal Sc2 is at a high level, the capacitance value C of the capacitor A6 reaches a resultant capacitance value (3 pF=1 pF+2 pF) of the capacitors A61 and A63. Besides, in a case where the slew rate setting signals Sc1 and Sc2 both are at the high level, the capacitance value C of the capacitor A6 reaches a resultant capacitance value (4 pF=1 pF+1 pF+2 pF) of the capacitors A61 to A63.

As described above, according to the capacitor A6 in the present structural example, it becomes possible to arbitrarily control variably the capacitance value C in accordance with the slew rate setting signals Sc1 and Sc2.

In the meantime, in the above description, the structure, in which only the dead time Td1 during which the gate signal G2 rises to the high level after the gate signal G1 rises to the high level is variably controlled, is described as an example; however, the structure of the dead time setting portion 24 is not limited to this, but when necessary, a structure may be employed, in which the dead time Td2, during which the gate signal G1 drops to the low level after the gate signal G2 drops to the low level, is variably controlled.

In a case where a function to variably control the dead time Td2 is not given to the delay portion 242, as the delay portion 242, it is possible to use a general delay circuit that uses an inverter, a buffer, a D flip-flop or the like. On the other hand, in a case where the function to variably control the dead time Td2 is given to the delay portion 242, as the delay portion 242, it is possible to use a delay circuit that includes the same structure as the delay portion 241 (FIG. 3).

Besides, in the above description, the structure, in which the dead time Td1 is variably controlled in accordance with both slew rate setting signal Sc and input voltage Vi, is described as an example; however, the structure of the dead time setting portion 24 is not limited to this, but a structure may be employed, in which the dead time Td1 is variably controlled in accordance with only one of the slew rate setting signal Sc and the input voltage Vi. For example, in a case where the dead time Td1 is variably controlled in accordance with only the slew rate setting signal Sc, in the circuit structure of FIG. 3, a constant reference voltage (band gap voltage or the like that does not depend on the input voltage Vi) may be applied to the source of the transistor A1. On the other hand, in a case where the dead time Td1 is variably controlled in accordance with only the input voltage Vi, in the circuit structure of FIG. 3, the capacitance value of the capacitor A6 may be set fixedly.

<Driver Portion>

Figure 9:
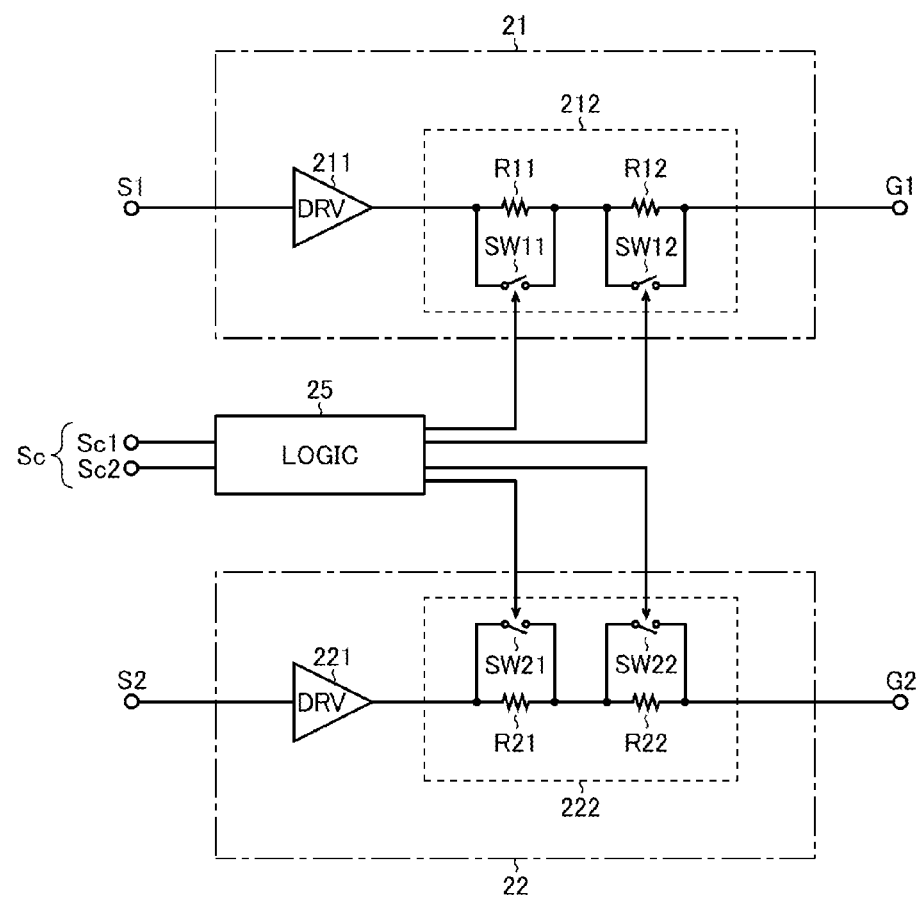
FIG. 9 is a circuit diagram showing a first structural example of driver portions 21 and 22.

FIG. 9 is a circuit diagram showing a first structural example of the driver portions 21 and 22. The driver portion 21 in the first structural example includes a pre-driver 211 and a slew rate setting, portion 212, while the driver portion 22 includes a pre-driver 221 and a slew rate setting portion 222.

The pre-driver 211 receives an input of the switch signal S1 to generate the gate signal G1. The slew rate setting portion 212 includes resistors R11, R12 (as to resistance value, R11<R12) and switches SW11, SW12, and variably controls an output resistance value of the pre-driver 211 in accordance with the slew rate setting signal Sc. The resistors R11 and R12 are connected in series with an output terminal of the pre-driver 211. The switches SW11 and SW12 are connected in parallel with the resistors R11 and R12, respectively and undergo on/off control performed by a logic portion 25.

The pre-driver 221 receives an input of the switch signal S2 to generate the gate signal G2. The slew rate setting portion 222 includes resistors R21, R22 (as to resistance value, R21<R22) and switches SW21, SW22, and variably controls an output resistance value of the pre-driver 221 in accordance with the slew rate setting signal Sc. The resistors R21 and R22 are connected in series with an output terminal of the pre-driver 221. The switches SW21 and SW22 are connected in parallel with the resistors R21 and R22, respectively and undergo on/off control performed by the logic portion 25.

The logic portion 25 receives inputs of the slew rate setting signals Sc1 and Sc2 to perform the on/off control of the switches SW11, SW12 and switches SW21, SW22.

For example, in a ease where the slew rate setting signals Sc1 and Sc2 both are at the low level, the logic portion 25 turns on all of the switches SW11, SW12 and switches SW21, SW22. As a result of this, all of the resistors R11 and R12 and resistors R21 and R22 go to a state to be short-circuited; accordingly, the output resistance values of the pre-drivers 211 and 221 both become substantially 0, and the slew rates of the gate signals G1 and G2 each go to a state to be set at the maximum value.

Besides, in a case where the slew rate setting signal Sc1 is at the high level and the slew rate setting signal Sc2 is at the low level, the logic portion 25 turns off the switches SW11, SW12 and turns on the switches SW12, SW22. As a result of this, the resistors R12 and R22 go to a state to be short-circuited; accordingly, the output resistance values of the pre-drivers 211 and 221 reach resistance values of the resistors R11 and R21, respectively and the slew rates of the gate signals G1 and G2 each go to a state to be pulled down by one step.

Besides, in a case where the slew rate setting signal Sc1 is at the low level and the slew rate setting signal Sc2 is at the high level, the logic portion 25 turns on the switches SW11, SW21 and turns off the switches SW12, SW22. As a result of this, the resistors R11 and R21 go to a state to be short-circuited; accordingly, the output resistance values of the pre-drivers 211 and 221 reach resistance values of the resistors R12 and R22, respectively and the slew rates of the gate signals G1 and G2 each go to a state to be pulled down by two steps.

Besides, in a case where the slew rate setting signals Sc1 and Sc2 both are at the high level, the logic portion 25 turns off all of the switches SW11, SW12 and switches SW21, SW22. As a result of this, the output resistance values of the pre-drivers 211 and 221 reach a resultant resistance value (=R11+R12) of the resistors R11 and R12, and a resultant resistance value (=R21+R22) of the resistors R21 and R22, respectively, and the slew rates of the gate signals G1 and G2 each go to a state to be set at the minimum value.

Figure 10:
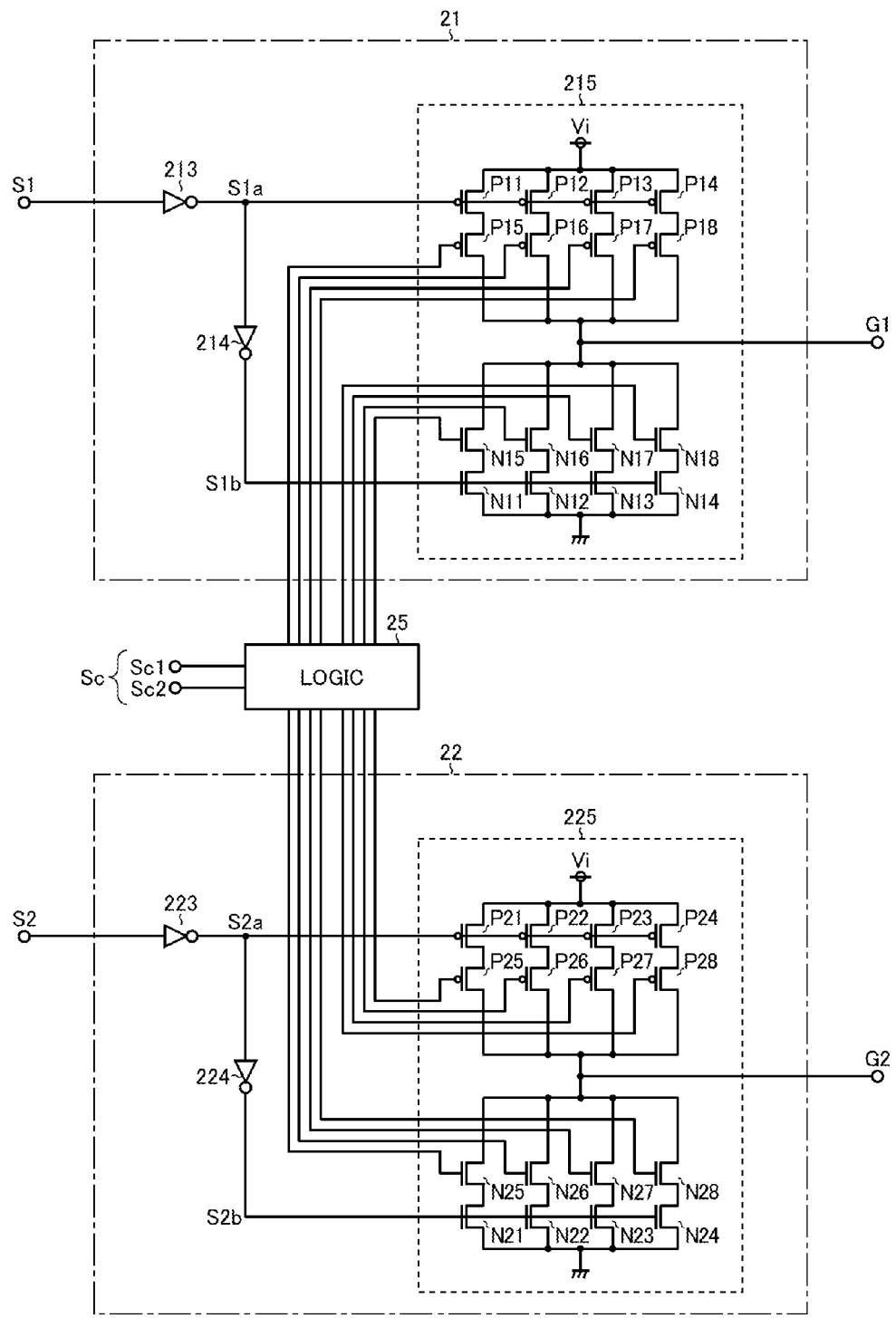
FIG. 10 is a circuit diagram showing a second structural example of the driver portions 21 and 22.
Figure 11:
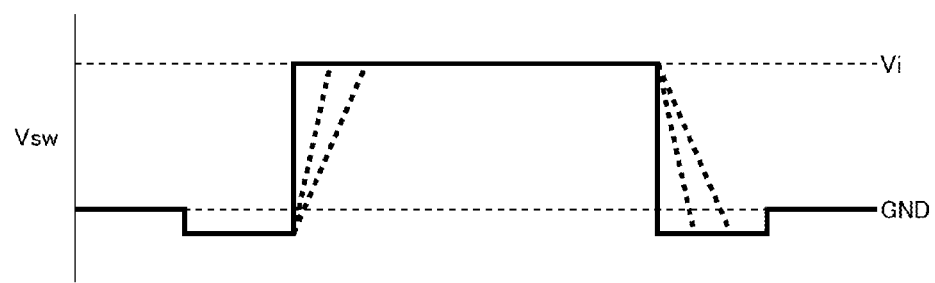
FIG. 11 is a waveform diagram showing a slew rate adjustment example of the driver portion 21.

FIG. 10 is a circuit diagram showing a second structural example of the driver portions 21 and 22. The driver portion 21 in the second structural example includes inverters 213, 214 and a slew rate setting portion 215, while the driver portion 22 includes inverters 223, 224 and a slew rate setting portion 225.

The inverter 213 reverses the logic of the switch signal S1 to generate an upper-side switch signal S1a. The inverter 214 reverses the logic of the upper-side switch signal S1a to generate a lower-side switch signal S1b.

The slew rate setting portion 215 includes: MOS field effect transistors P11 to P18 of P channel type; and MOS field effect transistors N11 to N18 of N channel type. Sources of the transistors P11 to P14 are all connected to the application terminal for the input voltage Vi. Gates of the transistors P11 to P14 are all connected to an application terminal for the upper-side switch signal S1a. Drains of the transistors P11 to P14 are connected to sources of the transistors P15 to P18, respectively. Drains of the transistors P15 to P18 are all connected to the application terminal for the gate signal G1. The transistors P15 to P18 undergo on/off control in accordance with gate signals from the logic portion 25, respectively. Sources of the transistors N11 to N14 are all connected to the ground terminal. Gates of the transistors N11 to N14 are all connected to an application terminal for the lower-side switch signal S1b. Drains of the transistors N11 to N14 are connected to sources of the transistors N15 to N18, respectively. Drains of the transistors N15 to N18 are all connected to the application terminal for the gate signal G1. The transistors N15 to N18 undergo on/off control in accordance with gate signals from the logic portion 25, respectively.

The transistors P11 and N11 form a first pre-driver (electric-current supply capability: ×1) that is switched to or not to be driven in accordance with the on/off control of the transistors P15 and N15. The transistors P12 and N12 form a second pre-driver (electric-current supply capability: ×2) that is switched to or not to be driven in accordance with the on/off control of the transistors P16 and N16. The transistors P13 and N13 form a third pre-driver (electric-current supply capability: ×5) that is switched to or not to be driven in accordance with the on/off control of the transistors P17 and N17. The transistors P14 and N14 form a fourth pre-driver (electric-current supply capability: ×10) that is switched to or not to be driven in accordance with the on/off control of the transistors P18 and N18. In other words, the slew rate setting portion 215 is structured to decide a pre-driver to be driven from the plurality of candidates in accordance with an instruction (and the slew rate setting signal Sc) from the logic portion 25.

The inverter 223 reverses the logic of the switch signal S2 to generate an upper-side switch signal S2a. The inverter 224 reverses the logic of the upper-side switch signal S2a to generate a lower-side switch signal S2b.

The slew rate setting portion 215 includes: MOS field effect transistors P21 to P28 of P channel type; and MOS field effect transistors N21 to N28 of N channel type. Sources of the transistors P21 to P24 are all connected to the application terminal for the input voltage Vi. Gates of the transistors P21 to P24 are all connected to an application terminal for the upper-side switch signal S2a. Drains of the transistors P21 to P24 are connected to sources of the transistors P25 to P28, respectively. Drains of the transistors P25 to P28 are all connected to the application terminal for the gate signal G2. The transistors P25 to P28 undergo on/off control in accordance with gate signals from the logic portion 25, respectively. Sources of the transistors N21 to N24 are all connected to the ground terminal. Gates of the transistors N21 to N24 are all connected to an application terminal for the lower-side switch signal S2b. Drains of the transistors N21 to N24 are connected to sources of the transistors N25 to N28, respectively. Drains of the transistors N25 to N28 are all connected to the application terminal for the gate signal G2. The transistors N25 to N28 undergo on/off control in accordance with gate signals from the logic portion 25, respectively.

The transistors P21 and N21 form a first pre-driver (electric-current supply capability: ×1) that is switched to or not to be driven in accordance with the on/off control of the transistors P25 and N25. The transistors P22 and N22 form a second pre-driver (electric-current supply capability: ×2) that is switched to or not to be driven in accordance with the on/off control of the transistors P26 and N26. The transistors P23 and N23 form a third pre-driver (electric-current supply capability: ×5) that is switched to or not to be driven in accordance with the on/off control of the transistors P27 and N27. The transistors P24 and N24 form a fourth pre-driver (electric-current supply capability: ×10) that is switched to or not to be driven in accordance with the on/off control of the transistors P28 and N28. In other words, the slew rate setting portion 225 is structured to decide a pre-driver to be driven from the plurality of candidates in accordance with an instruction (and the slew rate setting signal Sc) from the logic portion 25.

The logic portion 25 receives the inputs of the slew rate setting signals Sc1 and Sc2 to perform the control of selecting a pre-driver (the on/off control of the transistors P15 to P18 and transistors N15 to N18 and the on/off control of the transistors P25 to P28 and transistors N25 to N28).

For example, in a case where the slew rate setting signals Sc1 and Sc2 both are at the low level, the logic portion 25 turns on all of the transistor P18, N18 and transistors P18, N18, and turns off the other transistors. As a result of this, the slew rate setting portions 215 and 225 go to a state to select the fourth pre-driver that has the largest electric-current supply capability; accordingly, the slew rates of the gate signals G1 and G2 each go to a state to be set at the maximum value.

Besides, in a case where the slew rate setting signal Sc1 is at the high level and the slew rate setting signal Sc2 is at the low level, the logic portion 25 turns on all of the transistor P17, N17 and transistors P27, N27, and turns off the other transistors. As a result of this, the slew rate setting portions 215 and 225 go to a state to select the third pre-driver that has the second largest electric-current supply capability; accordingly, the slew rates of the gate signals G1 and G2 each go to a state to be pulled down by one step.

Besides, in a case where the slew rate setting signal. Set is at the low level and the slew rate setting signal Sc2 is at the high level, the logic portion 25 turns on all of the transistor P16, N16 and transistors P26, N26, and turns off the other transistors. As a result of this, the slew rate setting portions 215 and 225 go to a state to select the second pre-driver that has the third largest electric-current supply capability; accordingly, the slew rates of the gate signals G1 and G2 each go to a state to be pulled down by two steps.

Besides, in a case where the slew rate setting signals Sc1 and Sc2 both are at the high level, the logic portion 25 turns on all of the transistor P15, N15 and transistors P25, N25, and turns off the other transistors. As a result of this, the slew rate setting portions 215 and 225 go to a state to select the first pre-driver that has the smallest electric-current supply capability; accordingly, the slew rates of the gate signals G1 and G2 each go to a state to be set at the minimum value.

In the meantime, in the above description, the structure, in which the plurality of pre-drivers different from each other in the electric-current supply capability are selectively driven, is described as an example; however, the structure of the slew rate setting portion 215 and 225 is not limited to this, but for example, a structure may be employed, in which the number of drive steps of a plurality of prepared pre-drivers is switched. In this case, the respective electric-current supply capabilities of the pre-drivers may be equal to each other.

As described in the first structural example (FIG. 9) and the second structural example (FIG. 10), according to the structure in which the slew rate adjustment function is given to the driver portions 21 and 22, in light of the efficiency increase and noise curbing, a user can adjust the slew rate arbitrarily and easily; accordingly, it becomes possible to reduce antinoise external components (Snubber circuit, chip bead and the like) or shorten a design period of the circuits.

In the meantime, in the first structural example (FIG. 9) and the second structural example (FIG. 10), the structure, in which the slew rates of both gate signals G1 and G2 are variably controlled, is described as an example; however, the structure of the slew rate setting portions 215 and 225 is not limited to this, but a structure may be employed, in which only one of the slew rates of the gate signals G1 and G2 is variably controlled.

For example, if the function to adjust the slew rate of the gate signal G1 is given to the driver portion 21, it becomes possible to adjust a change degree (inclination) of the switch voltage Vsw caused by on/off transition of the switch 11. If the on/off state of the switch 11 is switched, as shown in FIG. 1, the switch voltage Vsw changes dramatically between the negative voltage level (GND−Vf) during the dead time and the high level (Vi); accordingly, it is very important to adjust the change degree when optimizing the efficiency increase and noise curbing.

Figure 12:
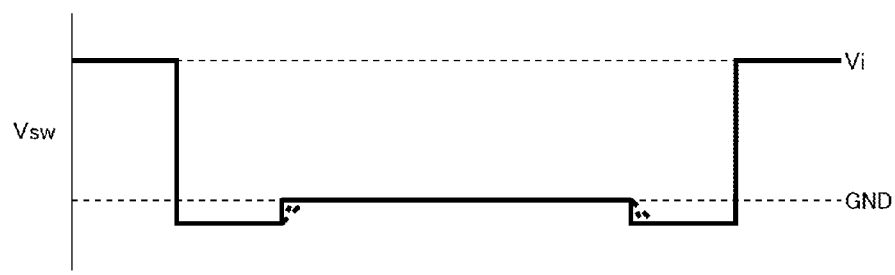
FIG. 12 is a waveform diagram showing a slew rate adjustment example of the driver portion 22.

On the other hand, in a case where the function to adjust the slew rate of the gate signal G2 is given to the driver portion 22, it becomes possible to adjust a change degree (inclination) of the switch voltage Vsw caused by on/off transition of the switch 12. However, when performing the on/off switchover of the switch 12, as shown in FIG. 12, the switch voltage Vsw changes only slightly between the negative voltage level (GND−Vf) during the dead time and the low level (GND); accordingly, it is not necessarily important to adjust the change degree when optimizing the efficiency increase and noise curbing. Because of this, in a case of prioritizing reduction in the circuit scale, the slew rate adjustment function may be given to the driver portion 21 only.

<Application to Television>

Figure 13:
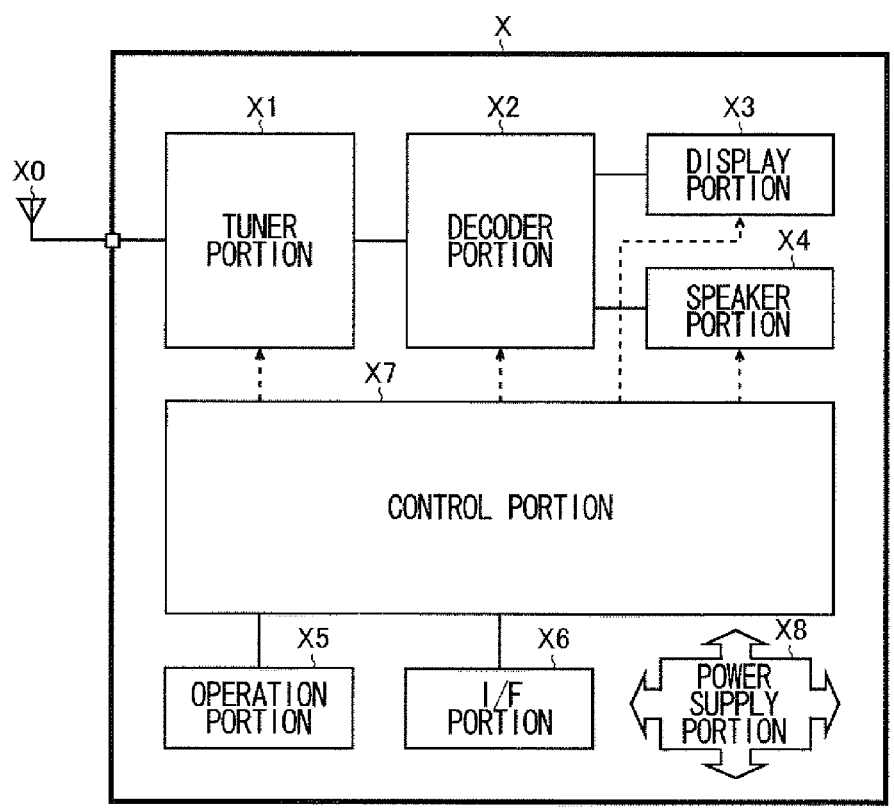
FIG. 13 is a block diagram showing a structural example of a television.
Figure 14A:
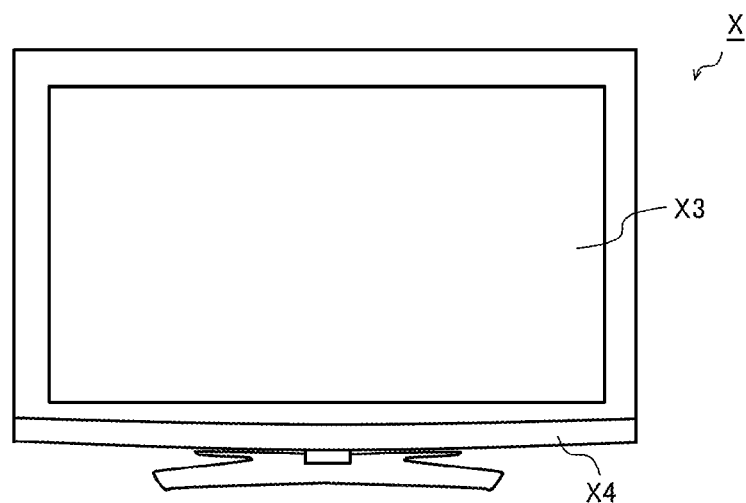
FIG. 14A is a front view of a television.
Figure 14B:
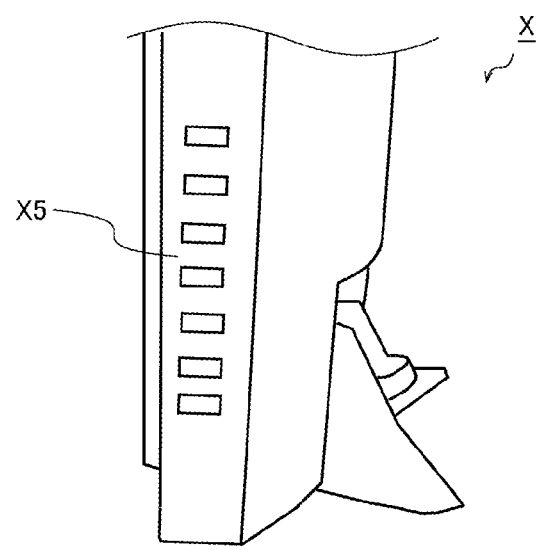
FIG. 14B is a side view of a television.
Figure 14C:
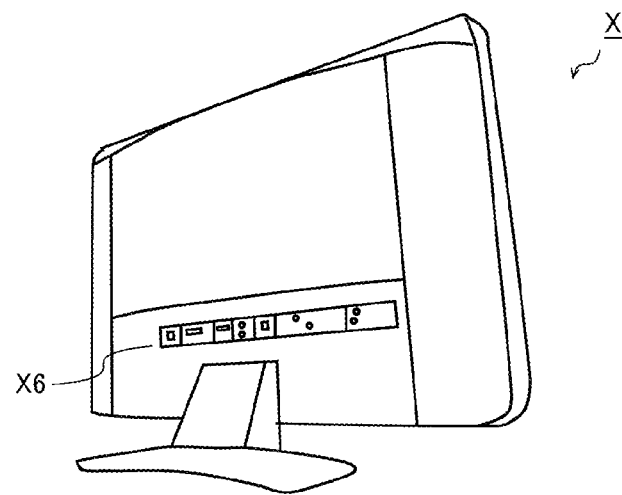
FIG. 14C is a rear view of a television.

FIG. 13 is a block diagram showing a structural example of a television. Besides, FIG. 14A to 14C are a front view, side view, and rear view of the television, respectively. The television X in the present structural example has: a tuner portion X1; a decoder portion X2; a display portion X3; a speaker portion X4; an operation portion X5; an interface portion X6; a control portion X7; and a power supply portion X8.

The tuner portion X1 selects a broadcast signal for a desired channel from a reception signal received by an antenna X0 that is externally connected to the television X.

The decoder portion X2 generates an image signal and voice signal from the broadcast signal selected by the tuner X1. Besides, the decoder portion X2 includes a function as well to generate an image signal and a voice signal based on an external input signal from the interface portion X6.

The display portion X3 outputs the image signal, which is generated by the decoder portion X2, as an image. As the display portion X3, it is possible to use a liquid crystal display panel and the like.

The speaker portion X4 outputs the voice signal, which is generated by the decoder portion X2, as a voice.

The operation portion X5 is a human interface that accepts a user operation. As the operation portion X5, it is possible to use a button, a switch, a remote controller and the like.

The interface portion X6 is a front end that accepts an external input signal from external devices (optical disc player, hard disc drive and the like).

The control portion X7 comprehensively controls the operation of each of the portions X1 to X6. As the control portion X7, it is possible to use a CPU [central processing unit] and the like.

The power supply portion X8 performs power supply to each of the portions X1 to X7. As the power supply portion X8, it is possible to preferably use the above switching regulator a of voltage step-down type.

<Other Modifications>

Figure 15:
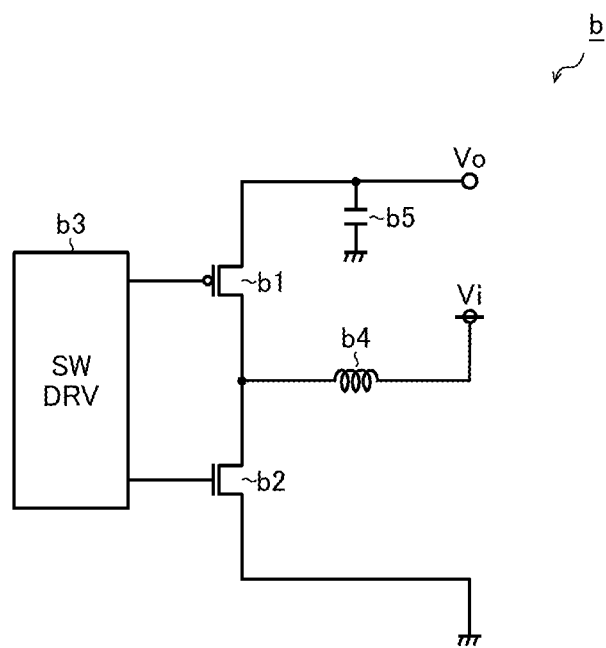
FIG. 15 is a block diagram showing a structural example of a switching regulator of voltage step-up type.
Figure 16:
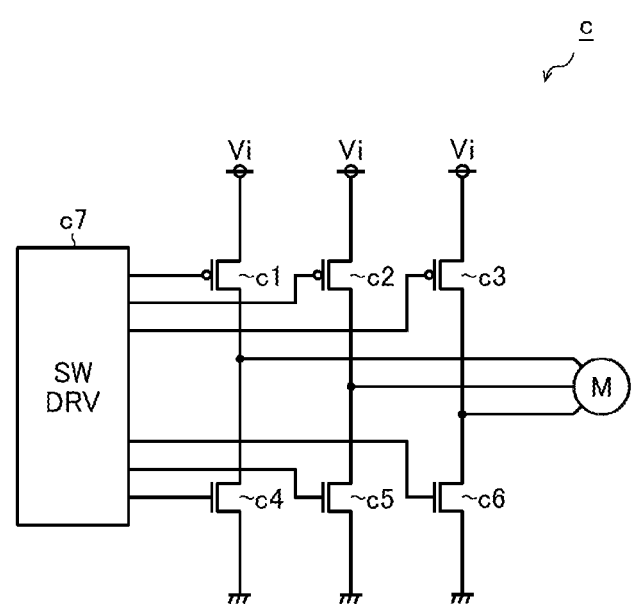
FIG. 16 is a block diagram showing a structural example of a motor driver.

In the meantime, in the above embodiments, the structure, in which the present invention is applied to the switching regulator a (FIG. 1) of voltage step-down type, is described as an example; however, the application target of the present invention is not limited to this, but the present invention is applicable to general switching regulators of synchronization rectification type (e.g., the switching regulator b (FIG. 15) of voltage step-up type that steps up the input voltage Vi to generate the output voltage Vo by driving the switch output stage). Further, the present invention is also applicable to the motor driver c (FIG. 16) that drives the output switch stage to supply an drive current to a motor and the like. Besides, as to applications as well to which the present invention is applied, besides the television (FIG. 13 and FIG. 14A to FIG. 14C), various electronic devices can be application targets.

As described above, the various technological features disclosed in the present specification are able to be modified in various ways without departing from the spirit of the technological creation besides the above embodiments. In other words, it should be considered that the above embodiments are examples in all respects and are not limiting, and the technological scope of the present invention is not indicated by the above description of the embodiments but by the claims, and all modifications within the scope of the claims and the meaning equivalent to the claims are covered.

INDUSTRIAL APPLICABILITY

The present invention is widely usable for general switch driving circuits that complementarily turn on/off a first switch and a second switch connected in series between two different electric potential points.

LIST OF REFERENCE NUMERALS 1 semiconductor apparatus (switch driving apparatus)
10 switch output stage
11 first switch (MOS field effect transistor of P channel type)
12 second switch (MOS field effect transistor of N channel type
20 switch driving circuit
21, 22 driver portions
211, 221 pre-drivers
212, 222 slew rate setting portions
213, 214, 223, 224 inverters
215, 225 slew rate setting portions
23 switch signal generation portion
231 control portion
2320R gate
233 AND gate
24 dead time setting portion
241, 242 delay portions
25 logic portion
A1 MOS field effect transistor of P channel type
A2, A3 MOS field effect transistors of N channel type
A4, A5 resistors
A6 capacitor
A61 to A63 capacitors
A64, A65 MOS field effect transistors of N channel type
A7, A8 inverters
P11 to P18, P21 to P28 MOS field effect transistors of P channel type
N11 to 18, N21 to N28 MOS field effect transistors of N channel type
R11, R12, R21, R22 resistors
SW11, SW12, SW21, SW22 switches
a switching regulator of voltage step-down type
b switching regulator of voltage step-up type
c motor driver
X television
X0 antenna
X1 tuner portion
X2 decoder portion
X3 display portion
X4 speaker portion
X5 operation portion
X6 interface portion
X7 control portion
X8 power supply portion

What is claimed is:

1. A switch driving circuit comprising:
a switch signal generation portion that generates a first switch signal and a second switch signal to complementarily turn on/off a first switch whose first terminal is connected to an application terminal for a first voltage and a second switch whose first terminal is connected to a second terminal of the first switch and whose second terminal is connected to an application terminal for a second voltage that is lower than the first voltage;
a first driver portion that receives an input of the first switch signal to generate a first gate signal for turning on/off the first switch;
a second driver portion that receives an input of the second switch signal to generate a second gate signal for turning on/off the second switch; and
a dead time setting portion that sets a first dead time which extends from a time when the first switch is turned off to a time when the second switch is turned on, and a second dead time which extends from a time when the second switch is turned off to a time when the first switch is turned on; wherein
at least one of the first driver portion and the second driver portion includes a slew rate setting portion that changes a slew rate of each gate signal in accordance with a slew rate setting signal; and the dead time setting portion variably controls at least one of the first dead time and the second dead time in accordance with at least one of the slew rate setting signal and the first voltage.

2. The switch driving circuit according to claim 1, wherein the dead time setting portion makes the first dead time and the second dead time shorter as the slew rate becomes faster or the first voltage becomes lower.

3. The switch driving circuit according to claim 2, wherein the dead time setting portion includes:
   a first delay portion that generates a first delay gate signal by giving a delay, which corresponds to the first dead time, to the first gate signal; and
   a second delay portion that generates a second delay gate signal by giving a delay, which corresponds to the second dead time, to the second gate signal; wherein
the switch signal generation portion logically generates a reference switch signal and the first delay gate signal to generate the second switch signal such that the second switch is turned on after the first dead time elapses after the first switch is turned off, and logically generates the reference switch signal and the second delay gate signal to generate the first switch signal such that the first switch is turned on after the second dead time elapses after the second switch is turned off.

4. The switch driving circuit according to claim 3, wherein at least one of the first delay portion and the second delay portion variably controls the delay given to each gate signal in accordance with at least one of the slew rate setting signal and the first voltage.

5. The switch driving circuit according to claim 4, wherein a size of the delay is decided by means of a discharge period during which a voltage between both terminals of a capacitor declines from a time of a discharge start to become lower than a threshold value at a predetermined time constant.

6. The switch driving circuit according to claim 5, wherein a capacitance value of the capacitor is variably controlled by the slew rate setting signal.

7. The switch driving circuit according to claim 5, wherein the capacitor is charged before the discharge start until the voltage between both terminals reaches the first voltage.

8. The switch driving circuit according to claim 6, wherein the capacitor is charged before the discharge start until the voltage between both terminals reaches the first voltage.

9. The switch driving circuit according to claim 1, wherein the slew rate setting portion variably controls an output resistance value of a pre-driver in accordance with the slew rate setting signal.

10. The switch driving circuit according to claim 1, wherein
the slew rate setting portion decides a pre-driver to be driven from a plurality of candidates in accordance with the slew rate setting signal.

11. A switch driving apparatus comprising:
a switch output stage that includes a first switch and a second switch; and
the switch driving circuit according to claim 1 that drives the switch output stage.

12. A switching regulator comprising:
the switch driving apparatus according to claim 11; wherein
the switching regulator drives a switch output stage to generate an output voltage from an input voltage.

13. A motor driver comprising:
the switch driving apparatus according to claim 11; wherein
the motor driver drives an switch output stage to supply a driving current to a motor.

14. An electronic apparatus comprising:
the switching regulator according to claim 12.

15. An electronic apparatus comprising:
the motor driver according to claim 13.

\* \* \* \* \*